United States Patent [19]
Shimizu et al.

[11] Patent Number: 5,457,391
[45] Date of Patent: Oct. 10, 1995

[54] LOAD SHORT-CIRCUIT DETECTION USING AWH-BRIDGE DRIVING CIRCUIT AND AN EXCLUSIVE-OR GATE

[75] Inventors: Toshifumi Shimizu; Yumiko Iwanami; Kazuhiro Mori, all of Kanagawa, Japan

[73] Assignee: NEC Corporation, Tokyo, Japan

[21] Appl. No.: 110,368

[22] Filed: Aug. 23, 1993

[30] Foreign Application Priority Data

Sep. 3, 1992 [JP] Japan .................................. 4-235774
Sep. 29, 1992 [JP] Japan .................................. 4-259185

[51] Int. Cl.$^6$ .................................................. G01R 31/08
[52] U.S. Cl. ........................ 324/546; 324/210; 324/523; 360/31
[58] Field of Search ...................... 324/210–212, 324/522–523, 546, 706, 713; 360/31; 361/86, 168.1, 169.1, 187

[56] References Cited

U.S. PATENT DOCUMENTS

| | | | |
|---|---|---|---|
| 4,203,137 | 5/1980 | Beck et al. ............................. | 360/31 |
| 4,736,267 | 4/1988 | Karlmann et al. ...................... | 361/93 |
| 4,746,869 | 5/1988 | Schrag et al. .......................... | 324/546 |
| 4,862,078 | 8/1989 | Kawabata ............................... | 324/212 |
| 4,890,183 | 12/1989 | Champiau ............................... | 361/86 |
| 5,087,884 | 2/1992 | Brannon ................................. | 324/546 |

*Primary Examiner*—Kenneth A. Wieder
*Assistant Examiner*—Christopher M. Tobin

[57] ABSTRACT

A load short-circuit state detection circuit has a driver including X and Y terminals between which an inductive load is connected and receiving drive signals. The detection circuit further includes a first transistor whose base is connected to the X terminal and whose collector is supplied with a voltage, a second transistor whose base is connected to the Y terminal and whose collector is also supplied with a voltage, a first constant current circuit connected to an emitter of the first transistor through a first resistor and a second constant current circuit connected to an emitter of the second transistor through a second resistor. A comparator is provided for comparing a voltage of a node between the first resistor and the first constant current circuit with a voltage of a node between the second resistor and the second constant current circuit. An exclusive OR gate circuit receives one of the drive signals supplied to the driver and an output signal of the comparator and executes an exclusive OR operation on these signals. The comparator is capable of detecting a potential difference between the two input signals.

4 Claims, 10 Drawing Sheets

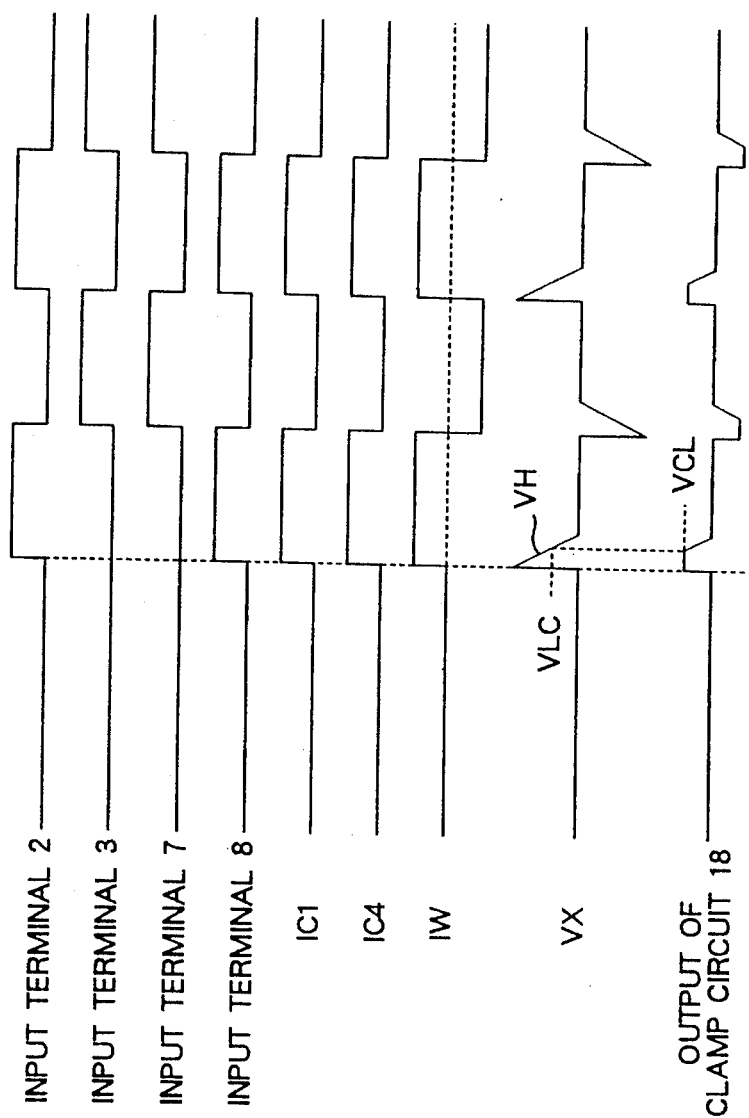
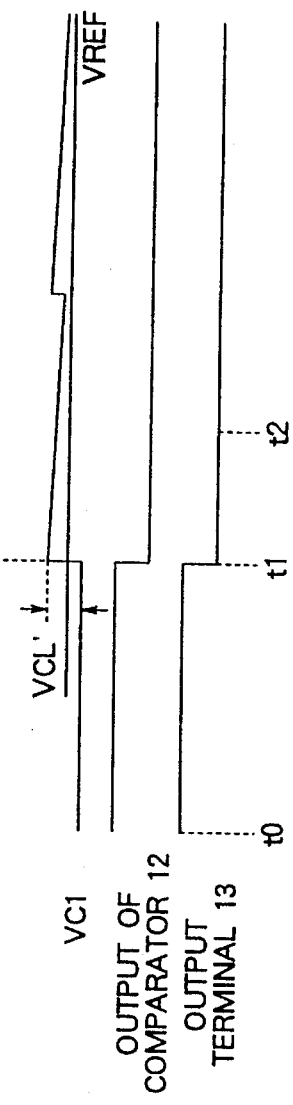
FIG. 2A (PRIOR ART) INPUT TERMINAL 2
FIG. 2B (PRIOR ART) INPUT TERMINAL 3
FIG. 2C (PRIOR ART) INPUT TERMINAL 7
FIG. 2D (PRIOR ART) INPUT TERMINAL 8
FIG. 2E (PRIOR ART) IC1
FIG. 2F (PRIOR ART) IC4
FIG. 2G (PRIOR ART) IW
FIG. 2H (PRIOR ART) VX
FIG. 2I (PRIOR ART) OUTPUT OF CLAMP CIRCUIT 18
FIG. 2J (PRIOR ART) VC1
FIG. 2K (PRIOR ART) OUTPUT OF COMPARATOR 12
FIG. 2L (PRIOR ART) OUTPUT TERMINAL 13

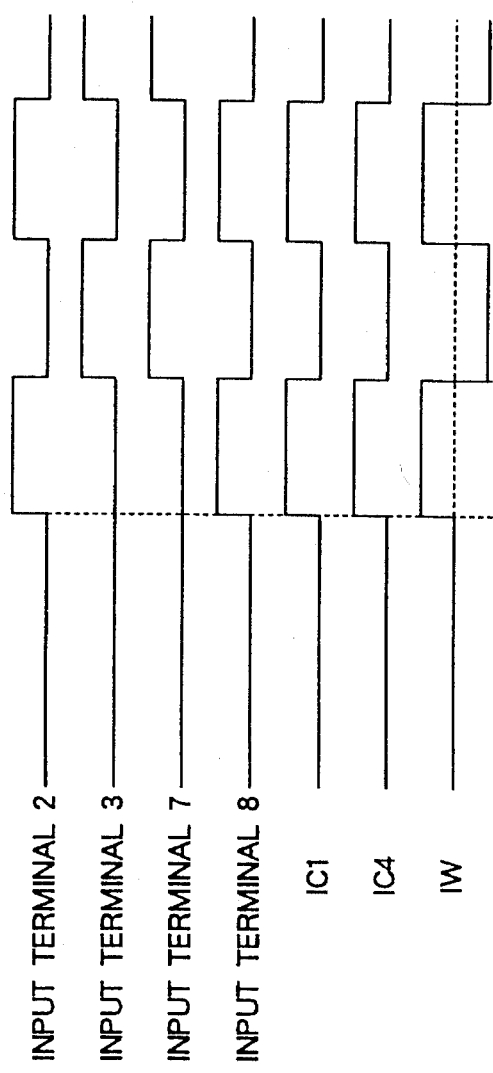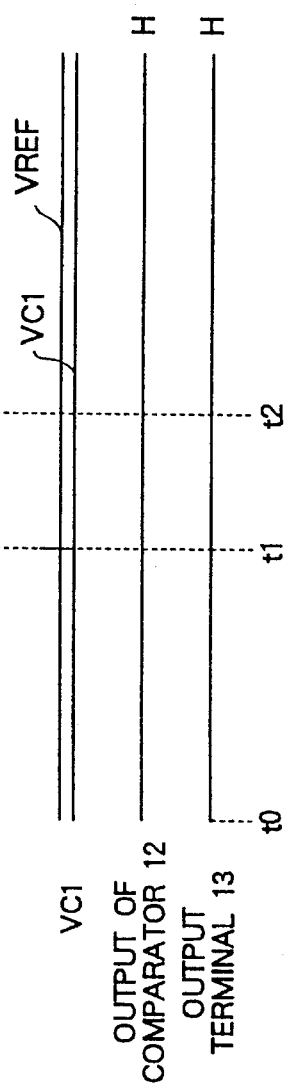

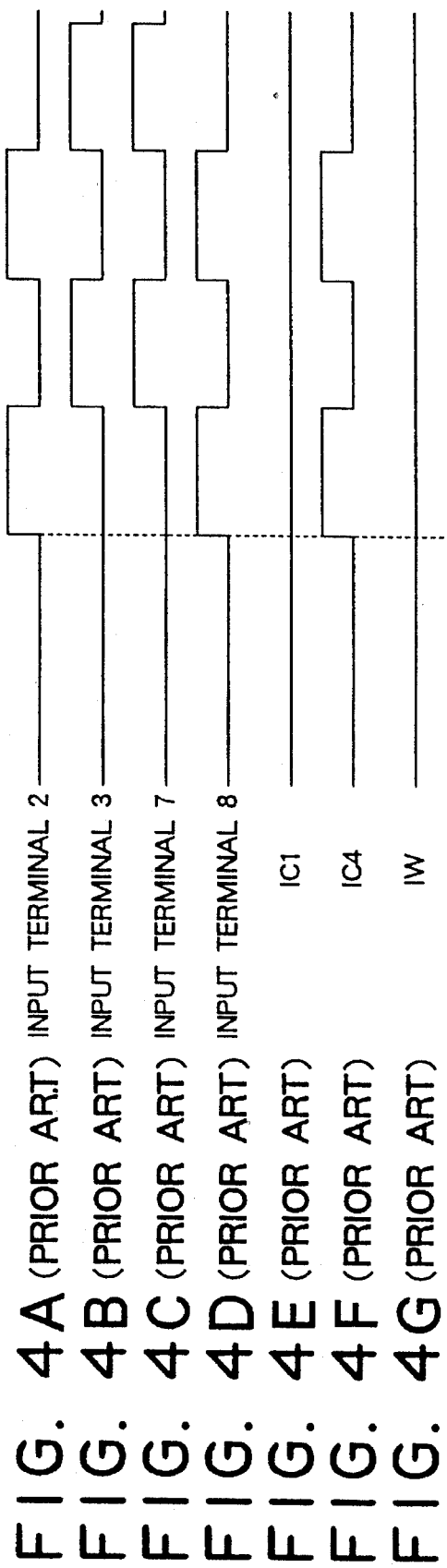
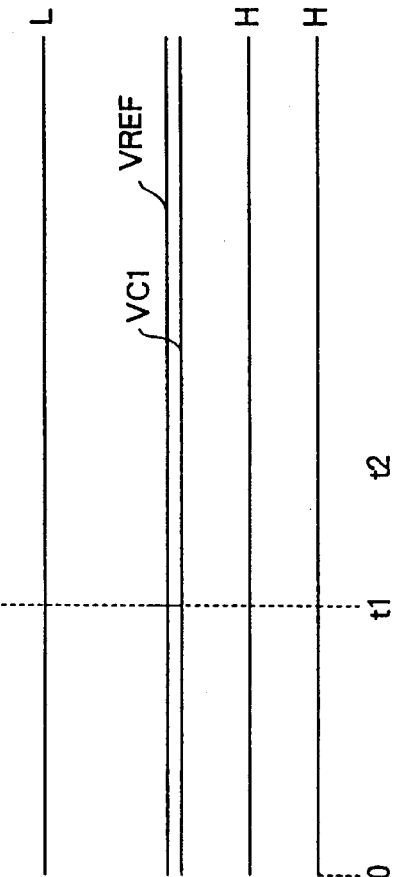
FIG. 4A (PRIOR ART) INPUT TERMINAL 2
FIG. 4B (PRIOR ART) INPUT TERMINAL 3
FIG. 4C (PRIOR ART) INPUT TERMINAL 7
FIG. 4D (PRIOR ART) INPUT TERMINAL 8
FIG. 4E (PRIOR ART) IC1
FIG. 4F (PRIOR ART) IC4
FIG. 4G (PRIOR ART) IW
FIG. 4H (PRIOR ART) VX
FIG. 4I (PRIOR ART) OUTPUT OF CLAMP CIRCUIT 18
FIG. 4J (PRIOR ART) VC1
FIG. 4K (PRIOR ART) OUTPUT OF COMPARATOR 12
FIG. 4L (PRIOR ART) OUTPUT TERMINAL 13

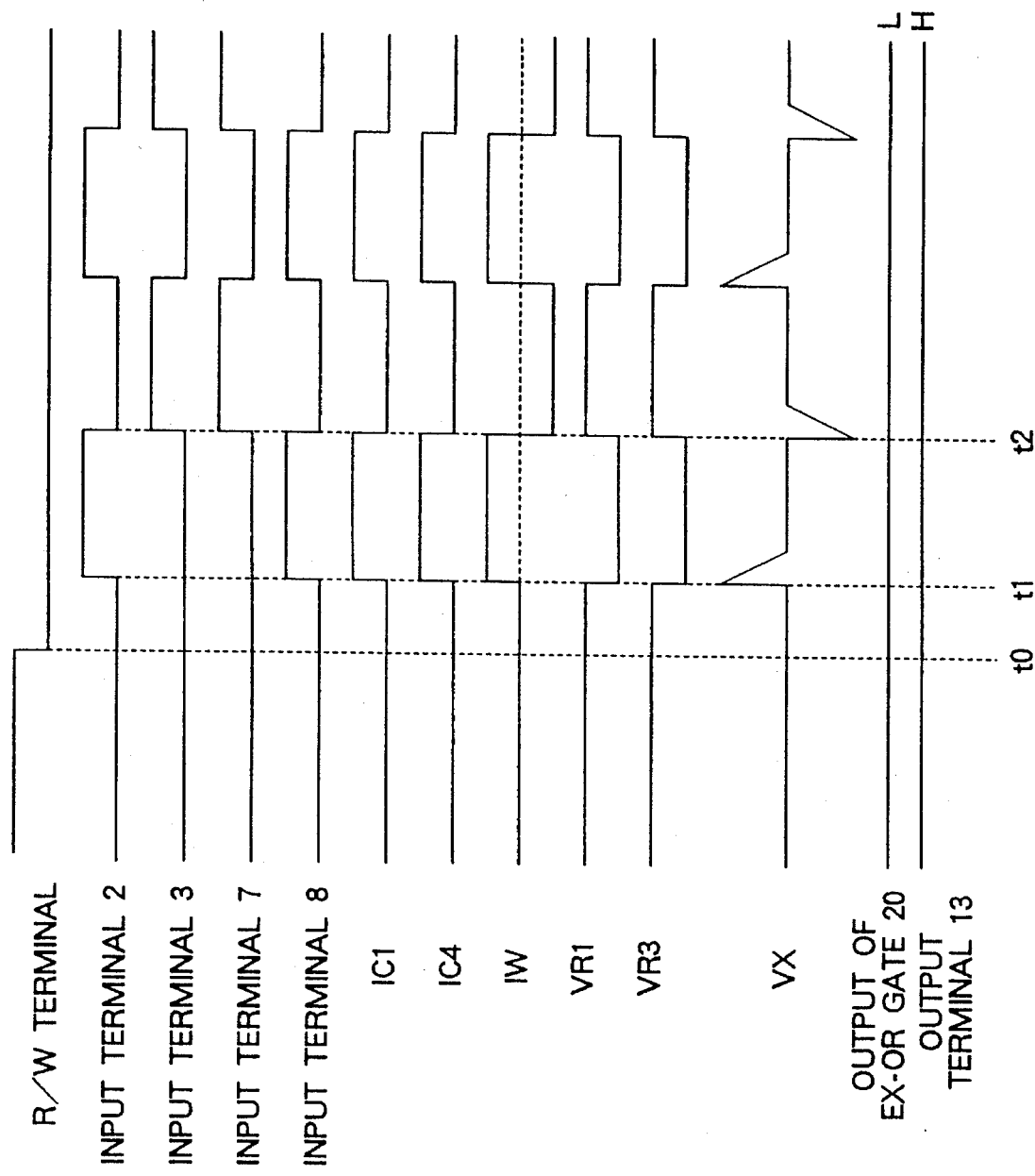

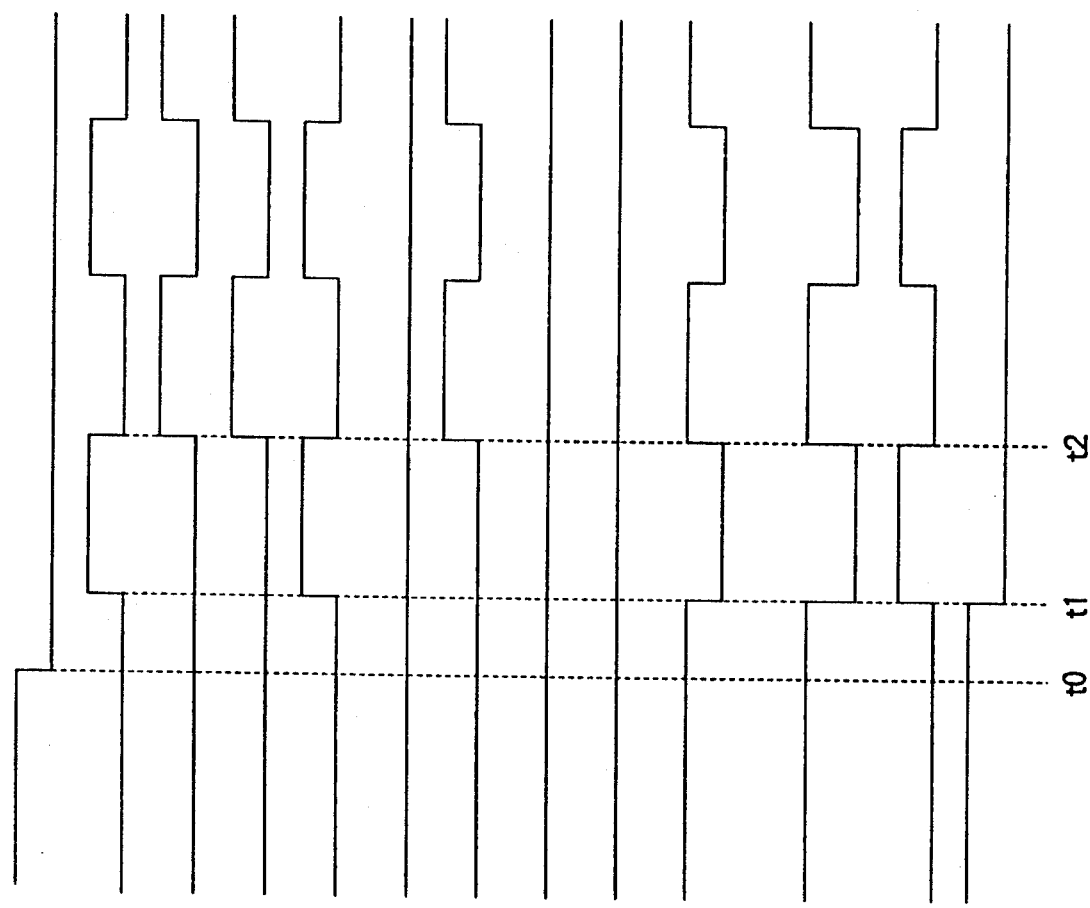

LOAD SHORT-CIRCUIT DETECTION USING AWH-BRIDGE DRIVING CIRCUIT AND AN EXCLUSIVE-OR GATE

BACKGROUND OF THE INVENTION

1. Field of the Invention

The present invention relates to a load short-circuit state and load open state detection circuit, and more particularly to a circuit for detecting a short-circuit state and an open state of an inductive load such as a magnetic head and the like.

2. Related Art

FIG. 1 shows an arrangement of a conventional load short-circuit state and load open state detection circuit. The detection circuit shown in FIG. 1 comprises an H-bridge type load driver comprised of NPN transistors Q1 through Q4 and a circuit for detecting the short-circuit state and the open state of an L-type (an inductive type) load connected to the driver.

Terminals 2, 3, 7 and 8 are respectively connected to the bases of the NPN transistors Q1 through Q4 for receiving driving signals for AC-driving the L-type load. The collectors of the transistors Q1 and Q3 are connected to a terminal 1 to which a power supply voltage Vcc is applied. An emitter of the transistor Q3 is connected to a collector of the transistor Q4. Emitters of the transistors Q2 and Q4 are connected to a constant current source 9. Emitters of the transistors Q1 and Q3 are connected to an X terminal 4 and a Y terminal 6, respectively. An L-type load is connected between the X and Y terminals 4 and 6. The L-type load is represented by a series circuit of an inductance LH and a resistor RH. The X terminal 4 is connected to an input terminal of a clamp circuit 18.

An output terminal of the clamp circuit 18 is connected to a base of an NPN transistor Q8. A collector of the NPN transistor Q8 is connected to the Vcc terminal 1, and an emitter of the transistor Q8 is grounded through a capacitor C1. A constant current source 16 and an inverted input terminal of a comparator 12 are connected to a node between the emitter of the transistor Q8 and the capacitor C1. A reference voltage VREF is applied to a non-inverted input terminal of the comparator 12. An output terminal of the comparator 12 is connected to an output terminal 13.

An operation of the detection circuit shown in FIG. 1 will now be described with reference to FIGS. 2A through 2L, 3A through 3L, and 4A through 4L. FIGS. 2A through 2L show waveforms of various components when the load is in a normal state. FIGS. 3A through 3L show waveforms of various components when the load is short-circuited (the X terminal 4 and the Y terminal 6 are short-circuited). FIGS. 4A through 4L show waveforms of various components when the load is in an open state (the X terminal 4 and the Y terminal 6 are electrically isolated).

An operation of the detection circuit shown in FIG. 1 will first be described with reference to FIGS. 2A through 2L when the load is in the normal state.

Drive signals shown in FIGS. 2A through 2D are applied to the input terminals 2, 3, 7, and 8, respectively for AC-driving the L-type load. When the drive signals are not applied to the input terminals 2, 3, 7, and 8 as at time t0, for example, the transistors Q1 through Q4 are cut off so that the currents IC1 and IC4 flowing into the transistors Q1 and Q4 are "0" as shown in FIGS. 2E and 2F current IW flowing into the load is also "0". Furthermore, the capacitor C1 is not charged so that a voltage across the capacitor C1 is "0" and a relation between an input voltage VC1 of the inverted terminal of the comparator 12 and the reference voltage VREF is VC1< VREF as shown in FIG. 2J. Accordingly, the output of the comparator 12 and the voltage of the output terminal 13 are both at an H (High) level, as shown in FIGS. 2K and 2L, respectively.

At time t1, a H-level drive signal is applied to the input terminals 2 and 8 as shown in FIGS. 2A and 2D as shown in FIGS. 2A and 2D, respectively. Furthermore, an L-level drive signal is applied to the input terminals 3 and 7 as shown in FIGS. 2B and 2C, respectively. Accordingly, the NPN transistors Q1 and Q4 are saturated and the NPN transistors Q2 and Q3 are cut off. For this reason, the currents IC1 and IC4 shown in FIGS. 2E and 2F flow into the transistors Q1 and Q4, respectively and the current IW shown in FIG. 2G flows into the load. Each of the values of currents IC1, IC4, and IW equals to a value of a current flowing into a constant current source 9.

At time t2, the L-level drive signal is applied to the input terminals 2 and 8 as shown in FIGS. 2A and 2D, respectively. Furthermore, the H-level drive signal is applied to the input terminals 3 and 7 as shown in FIGS. 2B and 2C, respectively. Accordingly, the NPN transistors Q1 and Q4 are cut off and the NPN transistors Q2 and Q3 are saturated. For this reason, the currents IC2 and IC3 flow into the NPN transistors Q2 and Q3, respectively and the current IW shown in FIG. 2G flows into the load. Each of absolute values of the currents IC2, IC3, and IW equals to the value of the current I0 flowing into the constant current source 9.

At time t1, when the current IW flows into the inductance LH of the load, a counter electromotive force VH is generated at the X terminal 4 as shown in FIG. 2H. This counter electromotive force VH is represented in the following equation:

$$VH = RH \times IW' (1 - e^{-(RH/LH)t}) \tag{1}$$

wherein IW'- is a load current IW when t hours has elapsed from time t1; and t- is a time which has elapsed from the time t1. If RH=10 Ω, LH=5 μH, IW'=1 mA, and t= 1 nS, then VH=5.0 V. A voltage VX including the counter electromotive force VH is supplied to the clamp circuit 18.

The clamp circuit 18 outputs a reference voltage VCL when the input signal VX is larger than a reference level VCL and outputs the input signal VX when the input signal VX is smaller than the reference level VCL. An output signal of the clamp circuit 18 is applied to the base of the NPN transistor Q8. At the time t1, the emitter voltage VC1 of the NPN transistor Q8 is represented by the following equation:

$$VC1 = VCL - VBEQ8 \tag{2}$$

wherein VBEQ8 is a base-emitter forward voltage of the NPN transistor Q8.

Since the VBEQ8 is constant, a change VCL' of the voltage VC1 to be applied to the capacitor C1 amounts to the VCL. At this time, the VC1 is larger than the reference voltage VREF as shown in FIG. 2J so that the voltages of the output of the comparator 12 and the output terminal 13 is at the L level as shown in FIGS. 2K and 2L, respectively.

The counter electromotive force VH decreases with the elapse of the time and the output of the clamp circuit 18 becomes smaller than the charging voltage VC1 of the capacitor C1 when VX (=VH)<VCL is satisfied so that the NPN transistor Q8 is cut off. Further, the inverted input terminal of the comparator 12 is connected to the constant current source 16 so that the VC1 is gradually decreased. The time constant τ of the decrease is represented by the following equation (3):

$$\tau = C1 \cdot (VCL' - VREF)/I1 \quad (3)$$

wherein I1 is a value of a current flowing into the constant current source 16.

As described above, when the drive signals are applied to the input terminals 2, 3, 7, and 8, the voltage of the output terminal 13 changes from the H level to the L level. Accordingly, it can be determined that the load connected between the X terminal 4 and the Y terminal 6 is normal.

An operation of the detection circuit shown in FIG. 1 when the load is short-circuited will now be described with reference to FIGS. 3A through 3L.

At time t1, the H-level drive signal is applied to the input terminals 2 and 8 as well as the L-level drive signal is applied to the input terminals 3 and 7 as shown in FIGS. 3A through 3D. For this reason, the NPN transistors Q1 and Q4 are saturated so that the currents IC1, IC4 and IW flow as shown in FIGS. 3E through 3G. However, the load is short-circuited so that the counter electromotive force VH is not generated as shown in FIG. 3H.

Accordingly, the output of the clamp circuit 18 is at the L level as shown in FIG. 3I so that the base voltage of the NPN transistor Q8 is at the L level. For this reason, the condition VC1<VREF is satisfied as shown in FIG. 3J so that the output of the comparator 12 and the output terminal 13 are at the H level as shown in FIGS. 3K and 3L.

As described above, even if the drive signals are applied to the input terminals 2, 3, 7, and 8, the voltage of the output terminal 1 is remained at the H level. Accordingly, it can be determined that the load connected between the X terminal 4 and the Y terminal 6 is in an abnormal state.

An operation of the detection circuit shown in FIG. 1 when the load is in the open state will now be described with reference to FIGS. 4A through 4L.

At time t1, the H-level drive signal is applied to the input terminals 2 and 8 and the L-level drive signal is applied to the input terminals 3 and 7 as shown in FIGS. 4A through 4D. For this reason, the NPN transistors Q1 and Q4 are saturated. However, since the load is in the open state, no load current IW flows. For this reason, the currents IC1 and IW are "0" as shown in FIGS. 4E and 4G, respectively. It is to be noted that a current flows into the NPN transistor Q4 through the NPN transistor Q3 and the waveform of the current is as shown in FIG. 4F. Furthermore, since the load is in the open state, the counter electromotive force is not generated as shown in FIG. 4H.

At time t2, the L-level drive signal is applied to the input terminals 2 and 8 and the H-level drive signal is applied to the input terminals 3 and 7 as shown in FIGS. 4A through 4D. For this reason, the NPN transistors Q1 and Q4 are cut off. Since the load is in the open state, no load current IW flows. As a result, the currents IC1, IC4, and IW are "0" as shown in FIGS. 4E through 4G, respectively. Furthermore, since the load is in the open state, the counter electromotive force VH is not generated as shown in FIG. 4H.

Accordingly, the output of the clamp circuit 18 is at the L level as shown in FIG. 4I so that the base voltage of the NPN transistor Q8 is at the L level. For this reason, the condition VC1<VREF is satisfied as shown in FIG. 4J so that the output of the comparator 12 and the voltage of the output terminal 13 remain at the H level as shown in FIGS. 4K and 4L, respectively.

As described above, even if the drive signal is applied to the input terminals 2, 3, 7, and 8, the voltage of the output terminal 13 remain at the H level so that it can be determined that the load connected between the X terminal 4 and the Y terminal 6 is in the abnormal state.

In order for the load state detection circuit operate normally, τ in equation (3) and the period T of the drive signal to be applied to the input terminals 2, 3, 7, and 8 must have relation of τ>T. When the time constant τ is small, the condition VC1<VREF is established during an interval of time t0 to time t2 so that the output of the comparator 12 is at the H level. As a result, the voltage of the output terminal 13 also turns at the H level which is identical to the output in the load short-circuited state and in the load open state.

As is apparent from the equation (3), the time constant τ depends on the changed amount VCL' of the voltage on the premise that the values of C1, VREF, and I1 are constant.

If the inductance LH connected to the X terminal 4 and the Y terminal 6 is assumed to be 1 μH, RH=10 Ω, LH 1 μH, IW'=1 mA, and t=1 nS, then VH=1.0 V. If the clamp voltage VCL of the clamp circuit 18 is set corresponding to the counter electromotive force VH (=5.0 V) at LH=5 μH, namely VCL=3.0 V, the counter electromotive force VH at LH =1 μH is not clamped so that the voltage VC1 at time t1 is VC1=VH−VBEQ8. Since VBEQ8 is constant, the changed amount VCL' of the voltage to be applied to the capacitor C1 is VH (=1.0 V). On the other hand, if LH=5 μH and VH= 5.0 V, the changed amount of the voltage to be applied to the capacitor C1 is 3.0 V (=VCL).

Accordingly, if C1=10 pF, I1=20 μA, VREF=0.5 V and VLC=3.0 V, τ at LH=5 μH and LH=1 μH is represented in the following equations:

$$\tau(LH=5\ \mu H)=(10\ pF \cdot (.0\ V-0.5\ V)/20\ \mu A=1.25\ \mu S$$

$$\tau(LH=1\ \mu H)=(10\ pF \cdot (.0\ V-0.5\ V)/20\ \mu A=0.25\ \mu S$$

As mentioned above before, in order for the load state detection circuit operate normally, τ>T must be satisfied. Accordingly, a frequency f of a signal to be applied to the input terminals 2, 3, 7, and 8 may be 800 KHz or more at LH=5 μH but must be 4 MHz or more at LH= 1 μH.

As described above, according to the conventional load-state detection circuit shown in FIG. 1, a problem is posed that the allowable frequency range of the drive signal to be applied to the input terminals 2, 3, 7, and 8 is changed depending on the value of the inductance LH of the load.

SUMMARY OF THE INVENTION

The present invention has been developed to overcome of the above drawbacks and its object is to provide a load short-circuit/open detection circuit which is free from the change of the allowable frequency range of the drive signal.

In order to achieve the above object, a load short-circuit detection circuit according to the present invention comprises: an H-bridge type load driver comprising first through fourth input terminals receiving first through fourth drive signals for AC-driving an inductive load, respectively, and an X terminal and a Y terminal between which the inductive load is connected; a first transistor a base of which is connected to the X terminal and a collector of which is applied with a first voltage (VCC); a first resistor one terminal of which is connected to an emitter of the first transistor; a first constant current source connected to the other terminal of the first resistor; a second transistor a base of which is connected to the Y terminal and a collector of which is applied with a second voltage (VCC); a second resistor one terminal of which is connected to an emitter of the second transistor; a second constant current source connected to the other terminal of the second resistor; a comparator for receiving a voltage of a node between the first resistor and the first constant current source and a voltage of a node between the second resistor and the second constant current source, for comparing the received voltages, and for outputting a signal with a level corresponding the comparison result; and a gate circuit for receiving one of the first through fourth drive signals and the signal output from the comparator.

A load open state detection circuit according to the present invention comprises: an X terminal and a Y terminal between which a load is connected; an H-bridge-type load driver for AC-driving the load, comprising a first transistor a base of which is connected to a first input terminal and a collector of which is applied with a predetermined voltage; a second transistor a base of which is connected to a second input terminal and a collector of which is connected to an emitter of the first transistor and the X terminal; a third transistor a base of which is connected to a third input terminal and a collector of which is applied with a predetermined voltage; and a fourth transistor a base of which is connected to a fourth input terminal, a collector of which is connected to the emitter of the third transistor and the Y terminal, and an emitter of which is connected to the emitter of the fourth transistor; a fifth transistor a base of which is connected to the base of the first transistor, a collector of which is connected to the collector of the first transistor through a resistor, and an emitter of which is connected to the emitter of the first transistor through a resistor; a sixth transistor a base of which is connected to the base of the fourth transistor, a collector of which is connected to the collector of the fourth transistor through a resistor, and an emitter of which is connected to the emitter of the fourth transistor through a resistor; and a logical gate circuit for receiving collector voltages of the fifth and sixth transistors.

According to the load short-circuit/open states detection circuit of the present invention having the above arrangements, the allowable frequency range of the drive signal is not changed even if the value of the inductance is changed. Accordingly, according to the load short-circuit/open state detection circuit of the present invention, the short-circuit state/open state of the load connected between the X terminal and the Y terminal can be accurately detected independent of the frequency of the drive signals.

BRIEF DESCRIPTION OF THE DRAWINGS

FIGS. 2A through 2L are timing charts for explaining an operation of the load state detection circuit shown in FIG. 1 when the load is in a normal state;

FIGS. 3A through 3L are timing charts for explaining an operation of the load state detection circuit shown in FIG. 1 when the load is in a short-circuit state;

FIGS. 4A through 4L are timing charts for explaining an operation of the load state detection circuit shown in FIG. 1 when the load is in an open state;

FIGS. 9A through 9M are timing charts for explaining an operation of the load open detection circuit shown in FIG. 8 when the load is in a normal state; and FIGS. 10A through 10M are timing charts for explaining an operation of the load open detection circuit shown in FIG. 8 when the load is in an open state.

DETAILED DESCRIPTION OF THE PREFERRED EMBODIMENTS

The embodiments of the load short-circuit/open detection circuit according to the present invention will now be described with reference to FIGS. 5 to 8.

Figure 1:
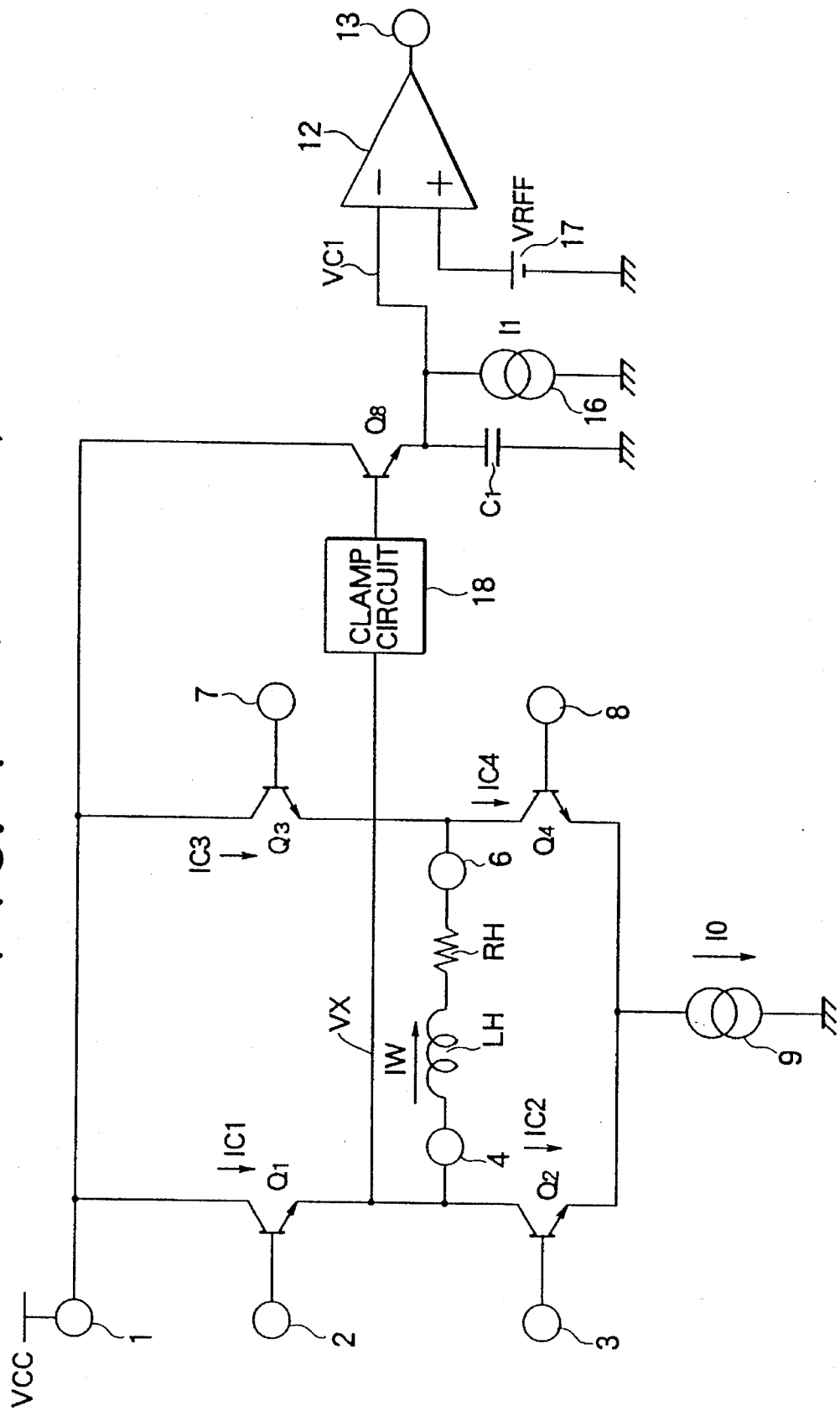
FIG. 1 is a block diagram showing a conventional load state detection circuit.
Figure 5:
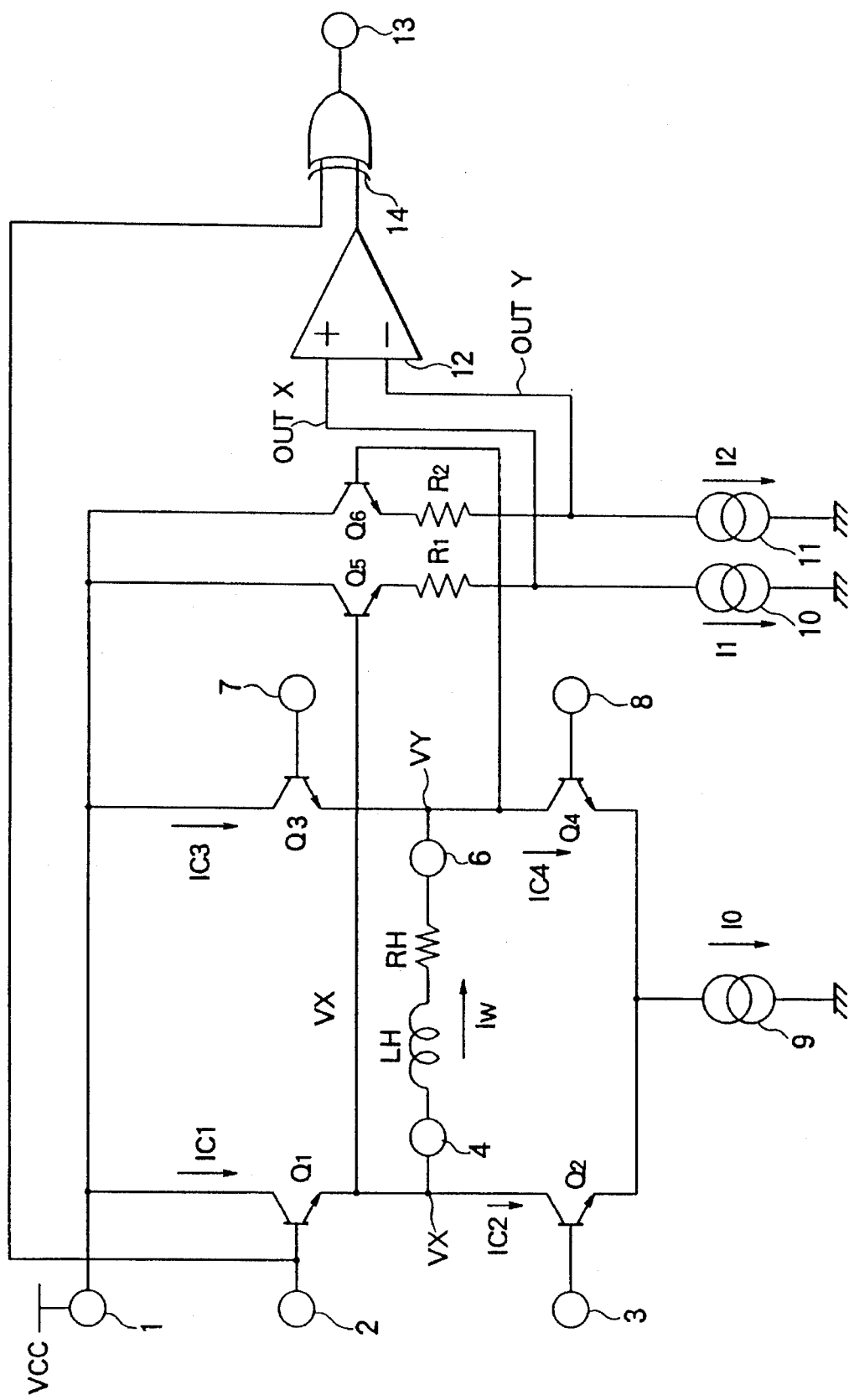
FIG. 5 is a block diagram showing a load short-circuit detection circuit according to a first embodiment of the present invention.
Figure 6:
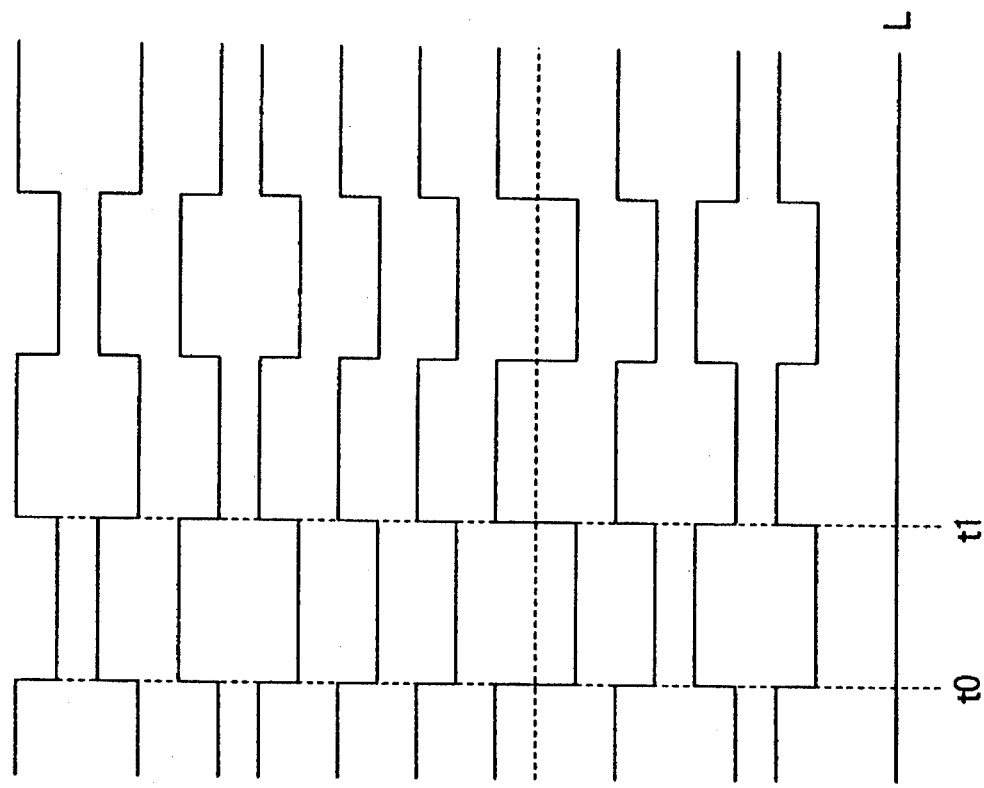
FIGS. 6A through 6K are timing charts for explaining an operation of the load short-circuit detection circuit shown in FIG. 5 when the load is in a normal state.
Figure 7:
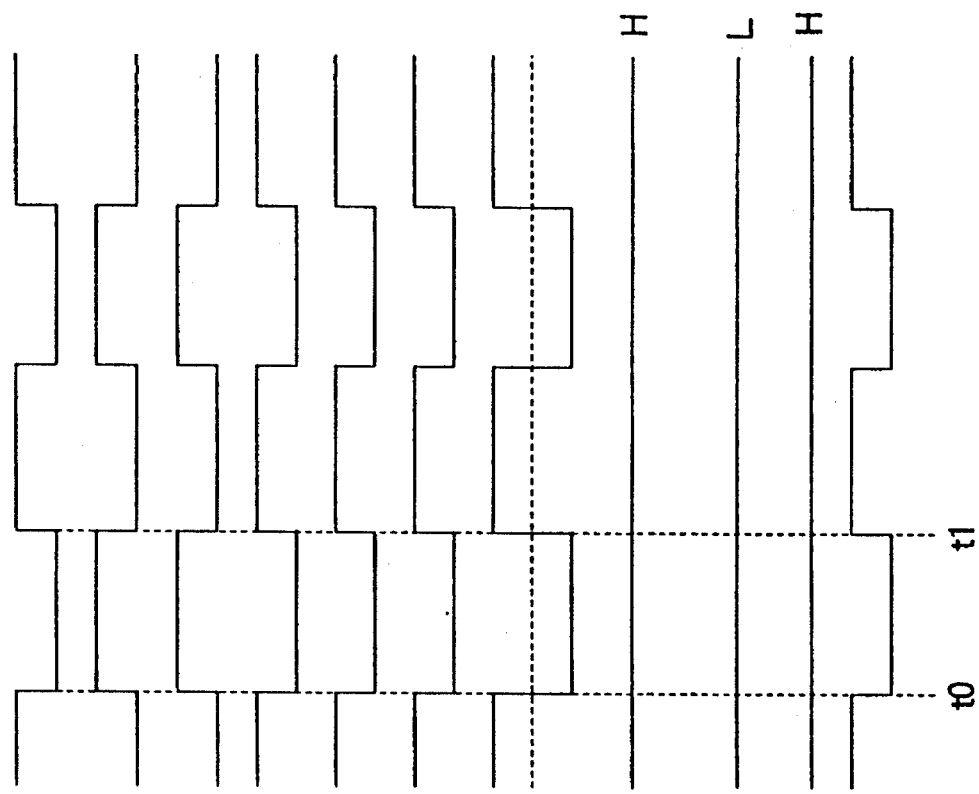
FIGS. 7A through 7K are timing charts for explaining an operation of the load short-circuit detection circuit shown in FIG. 5 when the load is in a short-circuit state.

The load short-circuit detection circuit shown in FIG. 5 is built, for example, in a read/write IC for driving a magnetic head of a hard disk apparatus or a floppy disk apparatus to detect a state of a coil in the magnetic head serving as a load. The load short-circuit detection circuit shown in FIG. 5 includes an H-bridge type load driver for AC-driving (driving with alternatively current) the magnetic head serving as the load in accordance with the write data. The H-bridge type load driver comprises read/write NPN transistors Q1 through Q4.

To the bases of the NPN transistors Q1 through Q4 are connected input terminals 2, 3, 7, and 8 for receiving drive signals for AC-driving an L-type load, respectively. As the drive signal, a signal having a waveform corresponding to write data is supplied when data is to be written (when a read/write switch signal indicates a write) as in a conventional read/write IC. Collectors of the transistors Q1 and Q3 are connected to an input terminal 1 to which a power supply voltage Vcc is applied, and an emitter of the transistor Q1 is connected to a collector of the transistor Q2. An emitter of the transistor Q3 is connected to a collector of the transistor Q4. The emitters of the transistors Q2 and Q4 are connected to a constant current source 9. The emitters of the transistors Q1 and Q4 are connected to an X terminal 4 and a Y terminal 6, respectively. An L-type load such as the coil of the magnetic head is connected between the X terminal 4 and the Y terminal 6. The L-type load is represented by a series circuit of an inductance LH and a resistor RH. The X terminal 4 is connected to a base of an NPN transistor Q5 and the Y terminal 6 is connected to a base of an NPN transistor Q6. Collectors of the NPN transistors Q5 and Q6 are connected to the Vcc terminal 1. An emitter of the NPN transistor Q5 is grounded through a resistor R1 and a constant current source 10. An emitter of the NPN transistor Q6 is grounded through a resistor R2 and a constant current source 11. A node of the resistor R1 and the constant current source 10 is connected to a non-inverted input terminal of a comparator 12. A node of the resistor R2 and the constant current source 11 is connected to an inverted input terminal of the comparator 12. An output signal from the comparator 12 and the drive signal supplied to the input terminal 2 are input to an exclusive-OR gate 14. An output terminal of the exclusive-OR gate 14 is connected to an output terminal 13 of the circuit.

An operation of the detection circuit shown in FIG. 5 will now be described with reference to FIGS. 6A through 6K and FIGS. 7A through 7K. FIGS. 6A through 6K show waveforms of various components when the load is in a normal state and FIGS. 7A through 7K show waveforms of the signals in the various the components shown in FIG. 5 when the load is in a short-circuit state (the X terminal 4 and the Y terminal 6 are short-circuited).

An operation of the load short-circuit detection circuit 5 shown in FIG. 5 when the load is in the normal state will first be described with reference to FIGS. 6A through 6K.

The drive signals for AC-driving the load shown in FIGS. 6A through 6D are supplied to the input terminals 2, 3, 7, and 8, respectively.

At time t0, L-level drive signals are supplied to the input terminals 2 and 8 as shown in FIGS. 6A and 6D, respectively, and H-level drive signals are supplied to the input terminals 3 and 7 as shown in FIGS. 6B and 6C, respectively. As a result, the NPN transistors Q1 and Q4 are cut off, and the NPN transistors Q2 and Q3 are saturated. For this reason, currents IC2 and IC3 flow into the NPN transistors Q2 and Q3, respectively, and a load current IW as shown in FIG. 6G flows into the load. A relation between the current values is IC2=IC3=−IW=I0. Note that I0 represents a current flowing into the constant current source 9.

At the time, signals OUTX and OUTY input to the comparator 12 shown in FIGS. 6H and 6I are represented as follows:

$$OUTX=VY-(IW \cdot RH+I1 \cdot R1+VBEQ5) \quad (4)$$

$$OUTY=VY-(I2 \cdot R2+VBEQ6) \quad (4)'$$

wherein OUTX represents a voltage of a node of the resistor R1 and a constant current source I1 and serves as an input signal to the non-inverted input terminal of the comparator 12; OUTY represents a voltage of a node of the resistor R2 and a constant current source I2 and serves as an input signal to the inverted terminal of the comparator 12; VY represents a voltage of the Y terminal 6; VBEQ5 represents a base-emitter forward voltage of the NPN transistor Q5; and VBEQ6 represents a base-emitter forward voltage of the NPN transistor Q6.

At time t1, the H-level drive signals are supplied to the input terminals 2 and 8 as shown in FIGS. 6A and 6D, respectively, and the L-level drive signals are supplied to the input terminals 3 and 7 as shown in FIGS. 6B and 6C, respectively. As a result, the NPN transistors Q1 and Q4 are saturated and the NPN transistors Q2 and Q3 are cut off. For this reason, the currents IC1 and IC4 flow into the NPN transistors Q1 and Q4, respectively and the load current IW shown in FIG. 6G flows into the load. A relation among the current values is IC2=IC3=IW=I0.

At this time, the signals OUTX and OUTY shown in FIGS. 6H and 6I, respectively are represented in the following equations:

$$OUTX=VX-(I1 \cdot R1+VBEQ5) \quad (5)$$

$$OUTY=VX-(IW \cdot RH+I2 \cdot R2+VBEQ6) \quad (5)'$$

wherein VX represents a voltage of the X terminal 4.

A difference between the OUTX and OUTY at time t0 is represented in the following equation:

$$OUTX-OUTY=I2 \cdot R2+VBEQ6-IW \cdot RH-I1 \cdot R1+VBEQ5 \quad (6)$$

A difference between the OUTX and OUTY at time t1 is represented in the following equation:

$$OUTX-OUTY=IW \cdot RH+I2 \cdot R2+VBEQ6-I1 \cdot R1-VBEQ5 \quad (7)$$

If the NPN transistors Q1 through Q6 are assumed to have substantially identical characteristics and I1=I2= I, the equation (6) can be represented as follows:

$$OUTX-OUTY=I \cdot (R2-R1)-IW \cdot RH \quad (8)$$

Similarly, the equation (7) can be represented as follows:

$$OUTX-OUTY=I \cdot (R2-R1)+IW \cdot RH \quad (9)$$

Accordingly, if the comparator 12 is arranged to detect a difference between the two input potentials 0.1 V, an output signal shown in FIG. 6J is obtained on the premises that I, IW, R1, R2, and RH are set to satisfy the following equation:

$$I \cdot (R2-R1)-IW \cdot RH<-.1 \quad (10)$$

The exclusive OR gate 14 exclusive-ORs the output signal from the comparator 12 shown in FIG. 6J and the drive signal to be supplied to the input terminal 2 shown in FIG. 6A. Since the signals shown in FIGS. 6J and 6A have the same signal level, the output signal from the exclusive-OR gate 14 is always at the L level.

The operation of the load short-circuit detection circuit shown in FIG. 5 when the load is in the short-circuit state will now be described with reference to FIGS. 7A through 7K.

At time t0, the L-level drive signals are supplied to the input terminals 2 and 8 and the H-level drive signals are supplied to the input terminals 3 and 7 as shown in FIGS. 7A through 7D. As a result, the NPN transistors Q2 and Q3 are saturated. For this reason, currents IC2 and IC3 flow into the NPN transistors Q2 and Q3, respectively, and a load current IW as shown in FIG. 7G flows into the load. A relation between the current values is IC2=IC3= −IW=I0. Note that I0 represents a current flowing into the constant current source 9.

At this time, signals OUTX and OUTY input to the comparator 12 shown in FIGS. 7H and 7I are represented as follows:

$$OUTX=VY-(I1 \cdot R1+VBEQ5) \quad (11)$$

$$OUTY=VY-(I2 \cdot R2+VBEQ6) \quad (11)'$$

At time t1, the H-level drive signals are supplied to the input terminals 2 and 8 and the L-level drive signals are supplied to the input terminals 3 and 7 as shown in FIGS. 7A through 7D. As a result, the NPN transistors Q1 and Q4 are saturated. For this reason, the currents IC1 and IC4 shown in FIGS. 7E and 7F flow into IC1 and IC4, respectively and the load current IW shown in FIG. 7G flows into the load. A relation between the current values is IC2 =IC3=IW=I0.

At this time, since the load is short-circuited the signals OUTX and OUTY shown in FIGS. 7H and 7I, respectively, are represented in the following equations:

$$OUTX=VX-(I1 \cdot R1+VBEQ5) \quad (12)$$

$$OUTY=VX-(I2 \cdot R2+VBEQ6) \quad (12)'$$

A difference between the OUTX and OUTY at time t0 is represented in the following equation:

$$OUTX-OUTY=I2 \cdot R2+VBEQ6-I1 \cdot R1-VBEQ5 \quad (13)$$

A difference between the OUTX and OUTY at time t1 is represented in the following equation:

$$OUTX-OUTY=I2 \cdot R2+VBEQ6-I1 \cdot R1-VBEQ5 \quad (14)$$

If the NPN transistors Q1 through Q6 are assumed to have substantially identical characteristics and I1=I2= I, the equation (13) can be represented as follows:

$$OUTX-OUTY=I \cdot (R2-R1) \quad (15)$$

Similarly, the equation (14) can be represented as follows:

$$OUTX - OUTY = I \cdot (R2 - R1) \quad (16)$$

Accordingly, if the comparator 12 can detect a difference between the two input potentials 0.1 V, an output signal shown in FIG. 7J is obtained on the premises that I, R1, and R2 are set to satisfy the following equation:

$$I \cdot (R2 - R1) - IW \cdot RH < -.1 \quad (17)$$

The exclusive OR gate 14 exclusive-ORs the output signal from the comparator 12 shown in FIG. 7J and the drive signal to be supplied to the input terminal 2 shown in FIG. 7A. For this reason, the exclusive-OR gate 14 outputs a signal having the same waveform as that of the drive signal supplied to the input terminal 2 as shown in FIG. 7K.

As described above, according to the load short-circuit detection circuit of the first embodiment, the values of the currents I and IW and the resistors R1, R2, and RH are set to satisfy the equations (18) and (19) when the comparator can detect a difference between the input voltages PV. As a result, the voltage of the output terminal 13 is fixed to a predetermined level when the load is in the normal state and is exhibited at the H level and the L level alternatively when the load is in the short-circuit state. Therefore, it can easily be determined whether the load is in the normal state or in the short-circuit state.

$$I \cdot (R2 - R1) - IW \cdot RH < -PV \quad (18)$$

$$I \cdot (R2 - R1) < -PV \quad (19)$$

In the above embodiment, the difference between the two input signals for inverting the output of the comparator 12 is 0.1 V but other values may be adopted. Further, the voltages OUTX and OUTY may be applied to the inverted and non-inverted input terminals of the comparator 12, respectively. In this case, the output signal from the comparator 12 will be an inverted signal of those shown in FIGS. 6J and 7J. Further, an OR gate or an AND gate may be used in place of the exclusive OR gate. Furthermore, the output signal from the comparator 12 may be used as the output signal of the detection circuit.

A circuit arrangement of the load open detection circuit according to the second embodiment of the present invention will now be described with reference to FIG. 8.

Figure 8:
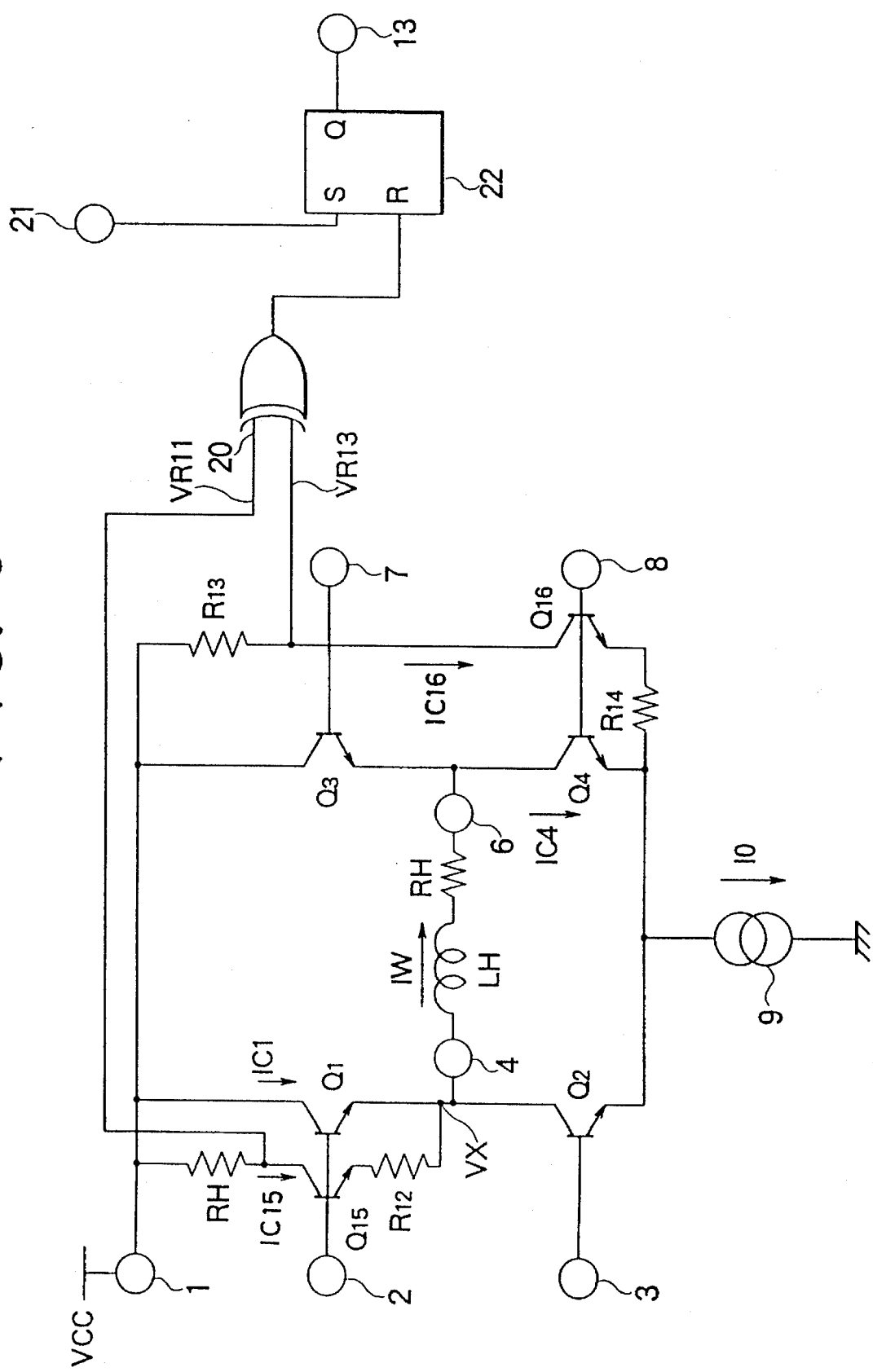
FIG. 8 is a block diagram showing a load open detection circuit according to a second embodiment of the present invention.

The load open detection circuit shown in FIG. 8 comprises an H-bridge type load driver and a circuit for detecting an open state of the L-type (inductance-type) load connected to the driver.

In FIG. 8, the same reference numerals are used for the same parts as in FIG. 5.

Input terminals 2, 3, 7 and 8 are connected to the bases of the NPN transistors Q1 through Q4 for receiving drive signals for AC-driving the L-type load. The collectors of the transistors Q1 and Q3 are connected to the terminal 1 to which the power supply Vcc is applied. The emitter of the transistor Q1 is connected to the collector of the transistor Q2. The emitter of the transistor Q3 is connected to the collector of the transistor Q4. The emitters of the transistors Q2 and Q4 are connected to the constant current source 9. The emitters of the transistors Q1 and Q4 are connected to the X terminal 4 and the Y terminal 6, respectively. The L-type load is connected between the X terminal 4 and the Y terminal 6. The L-type load is represented by a series circuit of the inductance LH and a resistor RH. The input terminal 2 is further connected to the base of an NPN transistor Q15. The collector of the NPN transistor Q15 is connected to the VCC terminal 1 through the resistor R11, and the emitter thereof is connected to the X terminal 4 through the resistor R12. The input terminal 8 is further connected to the base of an NPN transistor Q16. The collector of the NPN transistor Q16 is connected to the VCC terminal 1 through the resistor R13 and the emitter thereof is connected to the constant current source 9 through the resistor R14.

A node between the collector of the NPN transistor Q15 and the resistor R11, and a node between the collector of the NPN transistor Q16 and the resistor R13 are connected to the input terminals of an exclusive-OR gate 20. An output signal from the exclusive-OR gate 20 is supplied to a reset terminal of the set/reset latch 22. The set terminal of the set/reset latch 22 receives through a R/W terminal 21 a R/W (read/write) signal indicating reading data from or writing data into the disk (a magnetic recording medium). The Q output of the set/reset latch 22 is connected to the output terminal 13.

An operation of the load open state detection circuit shown in FIG. 8 will now be described with reference to FIGS. 9A through 9M and 10A through 10M. FIGS. 9A through 9M show waveforms of signals in the various components shown in FIG. 8 when the load is in the normal state and FIGS. 10A through 10M show waveforms of signals in the various components shown in FIG. 8 when the load is in the open state.

The operation of the load open state detection circuit shown in FIG. 8 will first be described with reference to FIGS. 9A through 9M.

As shown in FIG. 9A, the H-level R/W signal is supplied to the R/W terminal 21 until time t0. The RS flip-flop 22 is in the set state and the voltage of the output terminal 13 becomes at the H level as shown in FIG. 9M.

After the R/W signal becomes at the L level, the drive signals as shown in FIGS. 9B through 9E are supplied to the input terminals 2, 3, 7, and 8 for AC-driving the L-type load (to write data in the magnetic disk, for example).

At time t1, the H-level drive signals are supplied to the input terminals 2 and 8 and the L-level drive signals are supplied to the input terminals 3 and 7. As a result, NPN transistors Q1 and Q4 are saturated and the NPN transistors Q2 and Q3 are cut off. For this reason, the currents IC1 and IC4 shown in FIGS. 9F and 9G flow into the NPN transistors Q1 and Q4, respectively, and the load current IW shown in FIG. 9H flows into the load. A relation between the current values is IC1=IC4=IW=I0.

At time t2, the L-level drive signals are supplied to the input terminals 2 and 8 and the H-level drive signals are supplied to the input terminals 3 and 7 as shown in FIGS. 9B through 9E. As a result, the NPN transistors Q1 and Q4 are cut off and the NPN transistors Q2 and Q3 are saturated. For this reason, the currents IC2 and IC3 flow into the NPN transistors Q2 and Q3, respectively, and the load current IW shown in FIG. 9H flows into the load. A relation among the current values is IC1=IC4=-IW=I0.

At time t1, when the collector currents IC1 and IC4 flow into the NPN transistors Q1 and Q4, respectively, the collector currents IC15 and IC16 also flow into the NPN transistors Q15 and Q16, respectively. The collector currents IC15 and IC16 are represented by the following equations:

$$IC15 = k \cdot T \cdot ln\{(IC1/IS1)/(IC15/IS15))\}/(q \cdot R12) \quad (20)$$

$$IC16 = k \cdot T \cdot ln\ \{(IC4/IS4)/(IC16/IS16)\}/R4 \quad (20)'$$

wherein IS1, IS4, IS15, and IS16 represent base-emitter forward currents of the transistors Q1, Q4, Q15, and Q16, respectively; K represents a Boltzman constant; q represents a charge of an electron; and T represents an absolute temperature.

Voltage drops are caused in the resistors R11 and R12 due to the currents IC15 and IC16, respectively. For this reason, the input voltages VR11 and VR13 of the exclusive-OR gate 20 are represented by the following equations:

$$VR11 = VCC - R11 \cdot IC15 \ [IV] \quad (21)$$

$$VR13 = VCC - R13 \cdot IC16 \ [IV] \quad (21)'$$

If IS1=IS4, IS15=IS16, R11=R13, R12=R14, then VR11=VR13, IC1=IC4, and IC15=IC16.

Further, the currents IC15 and IC16 flow as long as the currents IC1 and IC4 flow. Accordingly, the waveforms of the voltage drops VR11 and VR13 are as shown in FIGS. 9I and 9J, respectively. Since the waveform of VR11 is identical with that of VR13, an output of the exclusive-OR gate 20 remains at the L level as shown in FIG. 9L. Accordingly, the set/reset latch 22 is not reset, and its Q output remains at the H level as well as the output terminal 13 remains at the H level as shown in FIG. 9M.

Note that as in the conventional detection circuit, the counter electromotive force VX is generated in the load as shown in FIG. 9K. However, according to the embodiment, the counter electromotive force VX is not used for detecting the open state of the load.

The operation of the load open state detection circuit when the load is in the open state will now be described with reference to FIGS. 10A through 10M. As shown in FIG. 10A, the R/W terminal 21 is at the H level until time t0, and the set/reset latch 22 is in the set state. Accordingly, the Q output of the set/reset latch 22 is also at the H level and thus the output terminal 13 becomes at the H level as shown in FIG. 10M.

At time t1, when the H-level drive signals are applied to the input terminals 2 and 8 and the L-level drive signals are applied to the input terminals 3 and 7 as shown in FIGS. 10B through 10D, the NPN transistors Q1 and Q4 are saturated. However, since the load is in the open state, the current IC1 is 0 as shown in FIG. 10F.

On the other hand, the current IC4 (FIG. 10G) identical to the current IC0 flows into the transistor Q4 through the transistor Q3. As is apparent from the equations (17) and (18), the current IC16 flows into the transistor Q16 but the current IC15 does not flow into the transistor Q15. Accordingly, the input voltages VR11 and VR13 (FIGS. 10I and 10J) of the exclusive-OR gate are represented by the following equations:

$$VR11 = VCC \quad (21)$$

$$VR13 = VCC - R13 \cdot IC16 \quad (21)'$$

Accordingly, at time t1, the inputs of the exclusive-OR gate become at H-level and L-level, respectively and thus the output of the exclusive-OR gate 20 becomes at the H level. Accordingly, at time t1, the set/reset latch 22 is reset and its Q output becomes at the L level and the output terminal 13 becomes at the L level as shown in FIG. 10M.

The voltage of the output terminal 13 remains at the L level until the set/reset latch 22 is set.

Note that since the load is in the open state, the voltage VX of the X terminal 4 changes as shown in FIG. 10K.

As has been described above, when the load is in the normal state, the output terminal 13 remains at the H level and when the load is in the open state, the output terminal 13 becomes at the L level upon the supplement of the driving signals. For this reason, it can be determined when the load is in the normal state or in the open state.

The present invention is not limited to the above embodiments. For example, other gates may be used in place of the exclusive-OR gate 20. Further, other flip-flops may be used in place of the set/reset latch 22. Furthermore, the output of the exclusive-OR gate may be used as the output of the detection circuit.

According to the first and second embodiments, the short-circuit state or the open state of the coil can be detected while driving the magnetic head to write data into the disk. Furthermore, the H-type driver for driving the magnetic head can be used to detect the short-circuit state or the open state of the load, resulting in a compact size.

In the above embodiments, the coil of the magnetic head is exemplified as an example of the load. However, the present invention can be applied to any inductive load.

What is claimed is:

1. A load short-circuit detection circuit, comprising:

an H-bridge-type load driving circuit provided with first through fourth input terminals to which first through fourth drive signals are supplied for driving an inductive load with an alternating current, and X and Y terminals between which the inductive load is connected;

a first transistor a base of which is connected to the X terminal and a collector of which is supplied with a first voltage;

a first resistor one terminal of which is connected to an emitter of the first transistor;

a first constant current source connected to the other terminal of the first resistor;

a second transistor a base of which is connected to the Y terminal and a collector of which is supplied with a second voltage;

a second resistor one terminal of which is connected to an emitter of the second transistor;

a second constant current source connected to the other terminal of the second resistor;

a comparing circuit for receiving a voltage of a node between the first resistor and the first constant current source and a voltage of a node between the second resistor and a second constant current source, comparing the received voltages and outputting a signal with a level corresponding to a comparison result;

an exclusive OR gate circuit, coupled to one of said first to fourth terminals and to said comparing circuit, for receiving one of the first through fourth drive signals and the signal outputted from the comparing circuit and executing an exclusive OR operation on said one of the drive signals and said outputted signal.

2. The circuit according to claim 1, wherein the H-bridge type load driving circuit comprises:

a third transistor a base of which is connected to the first input terminal and a collector of which is applied with a predetermined voltage;

a fourth transistor a base of which is connected to the second input terminal and a collector of which is connected to the emitter of the third transistor and the X terminal;

a fifth transistor a base of which is connected to the third input terminal and a collector of which is applied with a predetermined voltage;

a sixth transistor a base of which is connected to the fourth input terminal, a collector of which is connected to an emitter of the fifth transistor and the Y terminal, and an emitter of which is connected to an emitter of the fourth transistor; and a constant current circuit connected to the emitters of the fourth and sixth transistors;

and wherein the first and fourth drive signals having substantially same phase are supplied to the first and fourth input terminals and the second and third drive signals having substantially same phase but opposite to the phase of the first and fourth drive signals are supplied to the second and third input terminals.

3. The circuit according to claim 1, wherein:

the first voltage is identical with the second voltage;

a resistor value of the load is RH;

values of the first and second resistors are R1 and R2, respectively;

a value of a current flowing into the first and second transistors is I;

the first transistor is substantially identical with the second transistor;

a value of a current flowing into the load when the load is in a normal condition is IW;

the comparing circuit is capable of detecting a potential difference PV of two input signals; and the RH, R1, R2, I, IW, and PV satisfy the following two equations:

$$I \cdot (R2-R1) - IW \cdot RH < -PV$$

$$I \cdot (R2-R1) < -PV.$$

4. A load short-circuit detection circuit, comprising:

a driving circuit of H-bridge type, having X and Y terminals between which an inductive load is connected, for receiving at least one driving signal and supplying an alternating current to the inductive load in response to said at least one driving signal;

an amplifying circuit, coupled to the driving circuit, for amplifying voltages at the X and Y terminals;

a comparing circuit connected to the amplifying circuit, for comparing the amplified voltages of the X and Y terminals with each other and outputting a signal with a level corresponding to a comparison result; and an exclusive OR gate circuit, connected to the driving circuit and the comparing circuit, for executing an exclusive OR operation on said at least one driving signal and the signal outputted from the comparing circuit.

\* \* \* \* \*